United States Patent
Zang et al.

(10) Patent No.: US 10,497,692 B2
(45) Date of Patent: Dec. 3, 2019

(54) SRAM STRUCTURE WITH ALTERNATE GATE PITCHES

(71) Applicant: GLOBALFOUNDRIES INC., Grand Cayman (KY)

(72) Inventors: Hui Zang, Guilderland, NY (US); Randy W. Mann, Milton, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/689,934

(22) Filed: Aug. 29, 2017

(65) Prior Publication Data

US 2019/0067262 A1 Feb. 28, 2019

(51) Int. Cl.
| | |
|---|---|
| G11C 5/06 | (2006.01) |
| G11C 5/02 | (2006.01) |
| G11C 7/00 | (2006.01) |
| G11C 5/14 | (2006.01) |
| H01L 27/11 | (2006.01) |
| H01L 27/02 | (2006.01) |
| H01L 27/092 | (2006.01) |
| H01L 29/423 | (2006.01) |
| H01L 23/532 | (2006.01) |
| H01L 23/522 | (2006.01) |
| H01L 21/8238 | (2006.01) |
| H01L 21/768 | (2006.01) |
| H01L 23/528 | (2006.01) |

(52) U.S. Cl.
CPC ...... *H01L 27/0207* (2013.01); *H01L 21/7682* (2013.01); *H01L 21/76816* (2013.01); *H01L 21/76877* (2013.01); *H01L 21/82385* (2013.01); *H01L 21/823871* (2013.01); *H01L 23/5226* (2013.01); *H01L 23/5329* (2013.01); *H01L 27/092* (2013.01); *H01L 27/1104* (2013.01); *H01L 29/42376* (2013.01); *G11C 5/02* (2013.01); *G11C 5/025* (2013.01); *H01L 23/5286* (2013.01)

(58) Field of Classification Search
CPC ............. H01L 27/0207; H01L 27/092; H01L 27/1104; H01L 29/42376; H01L 23/5226; H01L 23/5329; H01L 21/76816; H01L 21/7682; H01L 21/76877; H01L 21/82385; H01L 21/823871
USPC ........ 257/369; 438/199; 365/154, 63, 72, 51
See application file for complete search history.

(56) References Cited

U.S. PATENT DOCUMENTS

| | | |
|---|---|---|
| 5,239,196 A | 8/1993 | Ikeda |
| 6,229,186 B1 | 5/2001 | Ishida |
| 6,329,225 B1 | 12/2001 | Rodder |
| 7,465,973 B2 | 12/2008 | Chang |

(Continued)

*Primary Examiner* — Ly D Pham
(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to a SRAM structure with alternate gate pitches and methods of manufacture. The structure includes an array of memory cells having a plurality of gate structures with varying gate pitches, the varying gate pitches comprising a first dimension sized for placement of a bitline contact and a second dimension sized for placement of source/drain contacts, the first dimension being larger than the second dimension.

19 Claims, 5 Drawing Sheets

(56) References Cited

U.S. PATENT DOCUMENTS

| | | | |
|---|---|---|---|
| 8,274,099 B2* | 9/2012 | Becker | H01L 27/0207 257/206 |
| 2005/0012125 A1* | 1/2005 | Summerfelt | H01L 27/11502 257/295 |
| 2005/0012157 A1 | 1/2005 | Ryoo | |
| 2006/0120133 A1* | 6/2006 | Star Sung | G11C 11/5692 365/94 |
| 2009/0273100 A1 | 11/2009 | Aton | |
| 2010/0171182 A1* | 7/2010 | Shin | H01L 29/7843 257/369 |
| 2011/0075470 A1 | 3/2011 | Liaw | |
| 2013/0181297 A1 | 7/2013 | Liaw | |
| 2015/0309229 A1* | 10/2015 | Ren | G02B 5/282 359/360 |
| 2016/0079084 A1* | 3/2016 | Chang | C09G 1/02 156/345.12 |
| 2016/0269004 A1* | 9/2016 | Chang | H03K 3/356104 |

* cited by examiner

SRAM STRUCTURE WITH ALTERNATE GATE PITCHES

FIELD OF THE INVENTION

The present disclosure relates to semiconductor structures and, more particularly, to a SRAM structure with alternate gate pitches and methods of manufacture.

BACKGROUND

A typical SRAM device includes an array of individual SRAM cells. Each SRAM cell is capable of storing a binary voltage value that represents a logical data bit (e.g., "0" or "1"). One existing configuration for an SRAM cell includes a pair of cross-coupled devices such as inverters. The inverters act as a latch that stores the data bit therein, so long as power is supplied to the memory array. In a conventional six-transistor (6T) cell, a pair of access transistors or pass gates (when activated by a word line) selectively couples the inverters to a pair of complementary bitlines (i.e., a bitline true and bitline complementary). Other SRAM call designs may include a different number of transistors (e.g., 4T, 8T, etc.).

In the SRAM, a sense amplifier senses low power signals from the bitline and amplifies a small voltage swing to recognizable logic levels so that the data can be interpreted properly by logic outside of the memory. In SRAM operation, in order to read a bit from a particular memory cell a wordline along the particular memory cell's row is turned on, which activates all of the cells in a row. The stored value (0 or 1) from the particular memory cell is then sent to the bitline associated with the particular memory cell. The sense amplifier at the end of two complimentary bitlines amplifies the small voltages to a normal logic level. The bit from the desired cell is then latched from the particular memory cell's sense amplifier into a buffer, and placed on an output bus.

In SRAM, though, bit-line capacitance tends to be critical for performance. For example, lower capacitance of the bit-line will result in improved access times. However, as advanced nodes become smaller, the reduction in bit-line capacitance is becoming more challenging.

SUMMARY

In an aspect of the disclosure, a structure comprises an array of memory cells having a plurality of gate structures with varying gate pitches, the varying gate pitches comprising a first dimension sized for placement of a bitline contact and a second dimension sized for placement of source/drain contacts, the first dimension being larger than the second dimension.

In an aspect of the disclosure, a static random access memory (SRAM), comprises: a plurality of gate structures; a first space between opposing gate structures of the plurality of gate structures; bitline contacts located in the first space between selected ones of the opposing gate structures; and a second space between other opposing gate structures of the plurality of gate structures, the second space being smaller than the first space.

In an aspect of the disclosure, a method comprises: forming a plurality of gate structures; forming a first space between opposing gate structures of the plurality of gate structures; forming bitline contacts located in the first space between selected ones of the opposing gate structures; and forming a second space between other opposing gate structures of the plurality of gate structures, the second space being smaller than the first space.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to an SRAM structure with alternate gate pitches and methods of manufacture. More specifically, the present disclosure provides a structure and method of manufacturing an SRAM array with gate pitches of different dimensions, e.g., alternately larger and smaller gate pitches, which provides improved SRAM performance in advanced nodes. By implementing the structures herein, advantageously, the SRAM array exhibits improved bitline capacitance reduction and Tread improvement, with no additional processing steps (compared to conventional SRAM structures).

The SRAM array of the present disclosure can be manufactured in a number of ways using a number of different tools. In general, though, the methodologies and tools are used to form structures with dimensions in the micrometer and nanometer scale. The methodologies, i.e., technologies, employed to manufacture the SRAM array of the present disclosure have been adopted from integrated circuit (IC) technology. For example, the structures are built on wafers and are realized in films of material patterned by photolithographic processes on the top of a wafer. In particular, the fabrication of the SRAM array uses three basic building blocks: (i) deposition of thin films of material on a substrate, (ii) applying a patterned mask on top of the films by photolithographic imaging, and (iii) etching the films selectively to the mask.

Figure 1:
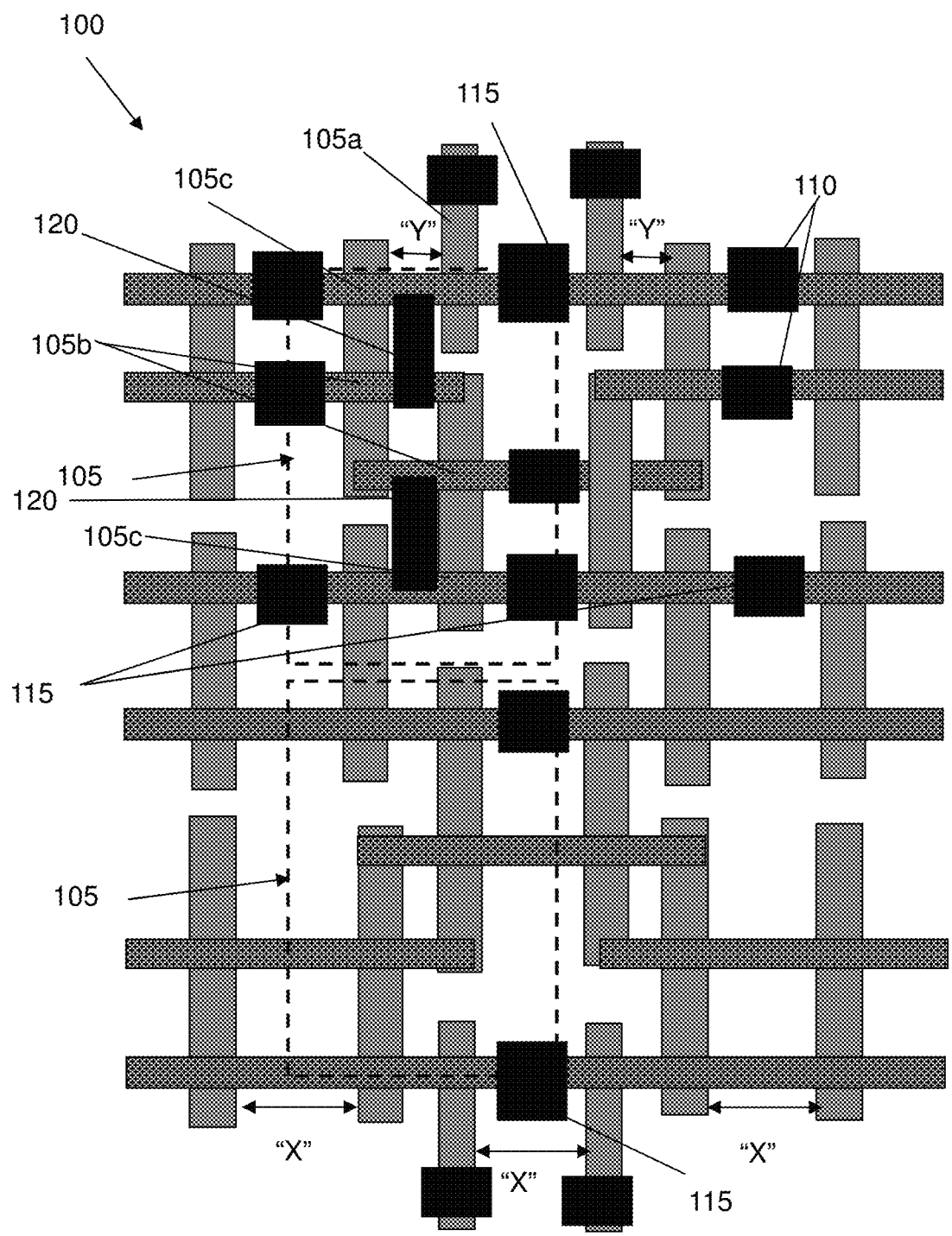
FIG. 1 shows a plan view of an SRAM array with alternate gate pitches in accordance with aspects of the present disclosure.

FIG. 1 shows a plan view of an SRAM array with alternate gate pitches in accordance with aspects of the present disclosure. More specifically, the SRAM array 100 shown in FIG. 1 includes a plurality of SRAM cells 105. In embodiments, the plurality of SRAM cells 105 can be a six transistor (6T) cell that has symmetry in both the horizontal and vertical orientations; although, as should be understood by those of skill in the art, the SRAM cells 105 can be other types of cells including, e.g., 4T, 8T, 10T, etc., transistors per bit.

In embodiments, the SRAM cells 105 each include a pass gate 105a, pull up gates 105b and pull down gates 105c (e.g., transistors), as should be understood by those of skill in the art. Moreover, the SRAM array 100 includes Vdd and Vcc contacts 110, in addition to bitline contacts 115 and source/drain contacts 120. In accordance with aspects of the present disclosure, the spacing (distance) "X" between the gates 105a, 105b, 105c for the Vdd, Vcc contacts 110 and the bitline contacts 115 is increased, e.g., larger, compared to spacing (distance) "Y" between gates 105a, 105b, 105c of non-critical areas (e.g., which do not have any contacts or for the source/drain contacts 120). In other words, "X">"Y". In embodiments, the distance "Y" can be made smaller compared to gate pitches in conventional SRAM arrays in order to maintain the same overall chip area.

In embodiments, the Vdd, Vcc contacts 110 and the bitline contacts 115 can be spaced from the respective gate structures 105a, 105b, 105c. In embodiments and as described further herein, the space between each of the contacts 110, 115 and the respective gate structures 105a, 105b, 105c can be filled with an insulator material (e.g., oxide) or air gap.

In further embodiments, the Vdd, Vcc contacts 110 and the bitline contacts 115 can be approximately 50 nm to 60 nm (in width), with the spacing between each of the contacts 110, 115 and the respective gate structures 105a, 105b, 105c being approximately 5 nm to about 20 nm or more. In this way, the distance "X" can be, e.g., about 55 nm to 80 nm (as measured from a sidewall of the gate structures); whereas, the distance "Y" can be, e.g., the width of the contact, itself, e.g., the source/drain contacts 120 can be abutting directly on the spacers of the gate structure structures 105a, 105b, 105c. In alternate embodiments, the spacing between the source/drain contacts 120 and respective gate structures can be other distances, e.g., less than 5 nm, which results in "Y"<"X". Accordingly, in embodiments, the gate pitches of the SRAM cell 105 can have different pitches.

Figure 4:
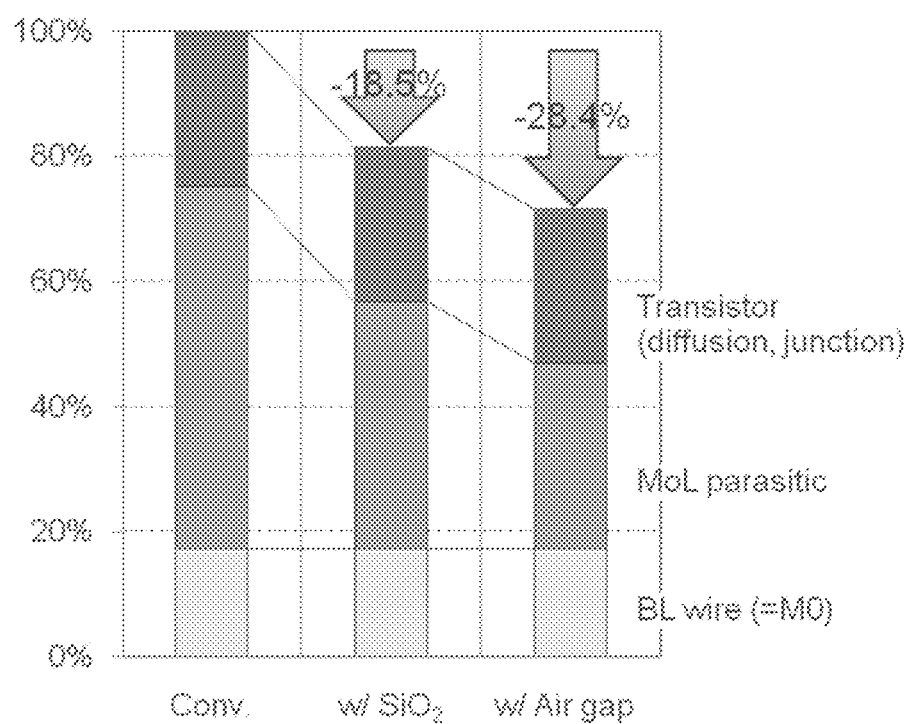
FIG. 4 shows a comparison graph of capacitance reduction.

In the configuration shown in FIG. 1, the SRAM array 100 can provide a significant reduction in the bite-line capacitance, while also providing an increased contact area for Vcc and Vdd (as described with respect to FIG. 4). Also, by providing this configuration, the performance gain from Tread is significantly improved, compared to conventional SRAM cells which have equal spacing between all of the gate structures of the cell. It should also be noted that the increased area for Vcc and Vdd contacts 110 allows for lower contact resistance and, hence, improved device performance.

Figure 2:
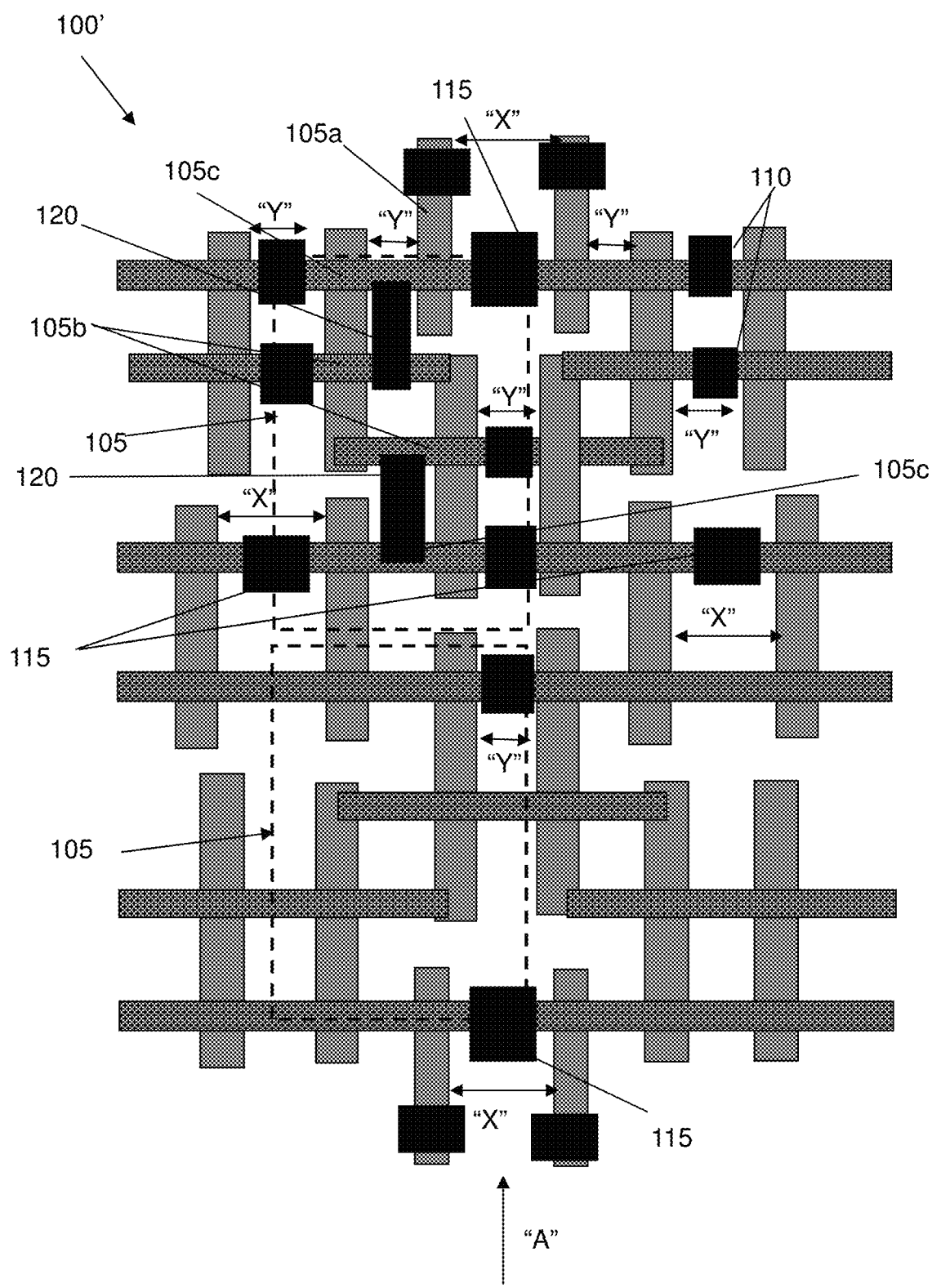
FIG. 2 shows a plan view of an SRAM array with alternate gate pitches in accordance with additional aspects of the present disclosure.

FIG. 2 shows a plan view of an SRAM array with alternate gate pitches in accordance with additional aspects of the present disclosure. More specifically, much like that shown and described with respect to FIG. 1, the SRAM array 100' shown in FIG. 2 includes a plurality of SRAM cells 105, e.g., a six transistor (6T) cell that has symmetry in both the horizontal and vertical orientations; although, the SRAM cells 105 can also be other types of cells including, e.g., 4T, 8T, 10T, etc., transistors per bit. As previously described, the SRAM cells 105 each include a pass gate 105a, pull up gates 105b and pull down gates 105c, in addition to Vdd, Vcc contacts 110, bitline contacts 115 and source/drain contacts 120.

In accordance with embodiments of this aspect of the present disclosure, only the spacing "X" between the gates 105a, 105b, 105c for the bitline contacts 115 is increased. That is, the spacing "X" for the bitline contacts 115 is larger than remaining spaces, e.g., space "Y" between the gate structures 105a, 105b, 105c for the Vdd, Vcc contacts 110 and source/drain contacts 120. In this embodiment, the spacing "X" and spacing "Y" may be different between gate structures within a same vertical orientation (vertical extent), as represented by arrow "A". In this implementation, the Vdd, Vcc contacts 110 may need to be reduced in size (compared to the embodiment shown in FIG. 1) due to the decreased contact area, e.g., spacing "Y".

As in the embodiment shown in FIG. 1, the alternative embodiment shown in FIG. 2 will have alternate gate pitches, where the larger pitch "X" provides a significant reduction in the bite-line capacitance. Also, by providing the configuration shown in FIG. 2, the performance gain from Tread is improved, compared to conventional SRAM cells which have equal spacing between all of the gate structures of the cell.

Figure 3A:
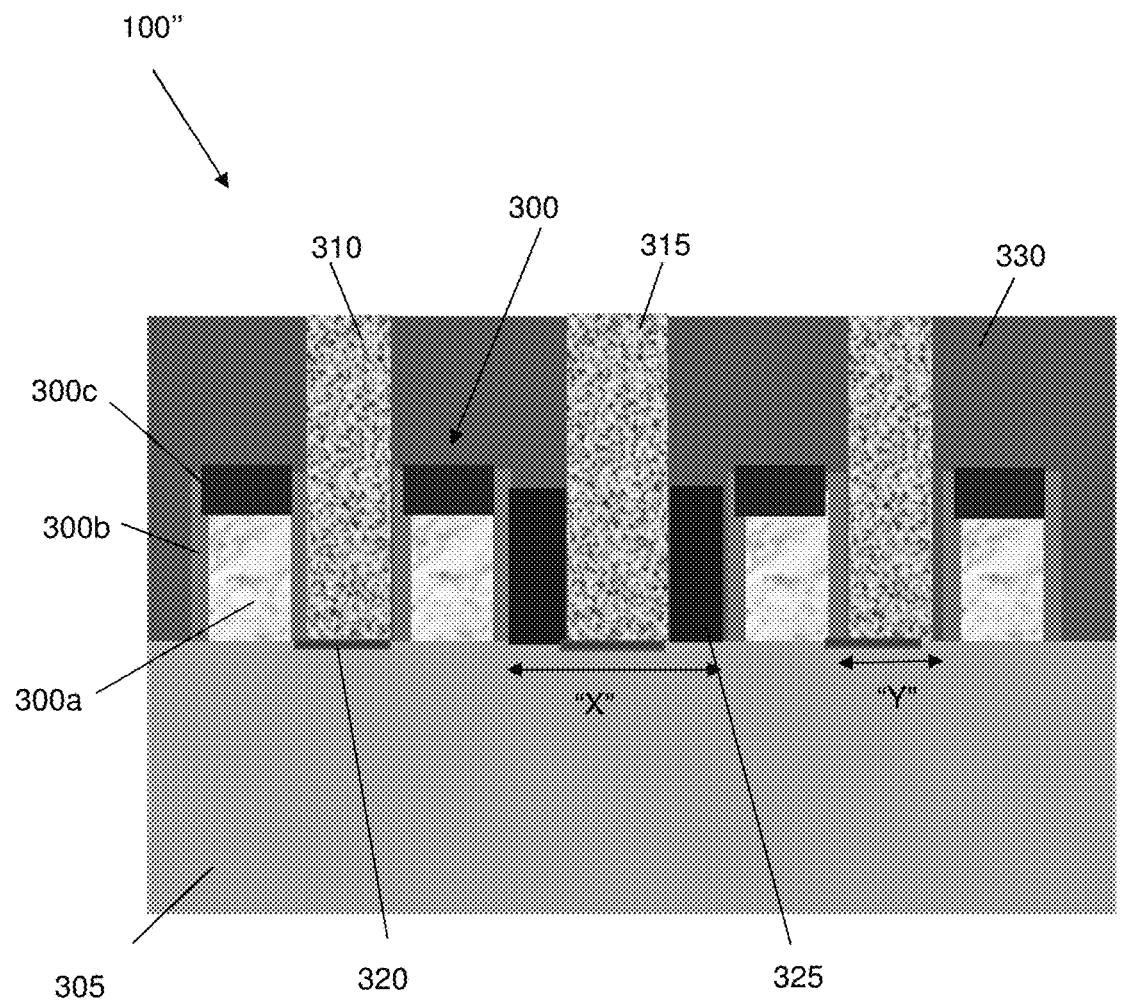
FIG. 3A shows a cross-sectional view of an SRAM structure with alternate gate pitches with a low-k dielectric material in accordance with additional aspects of the present disclosure.
Figure 3B:
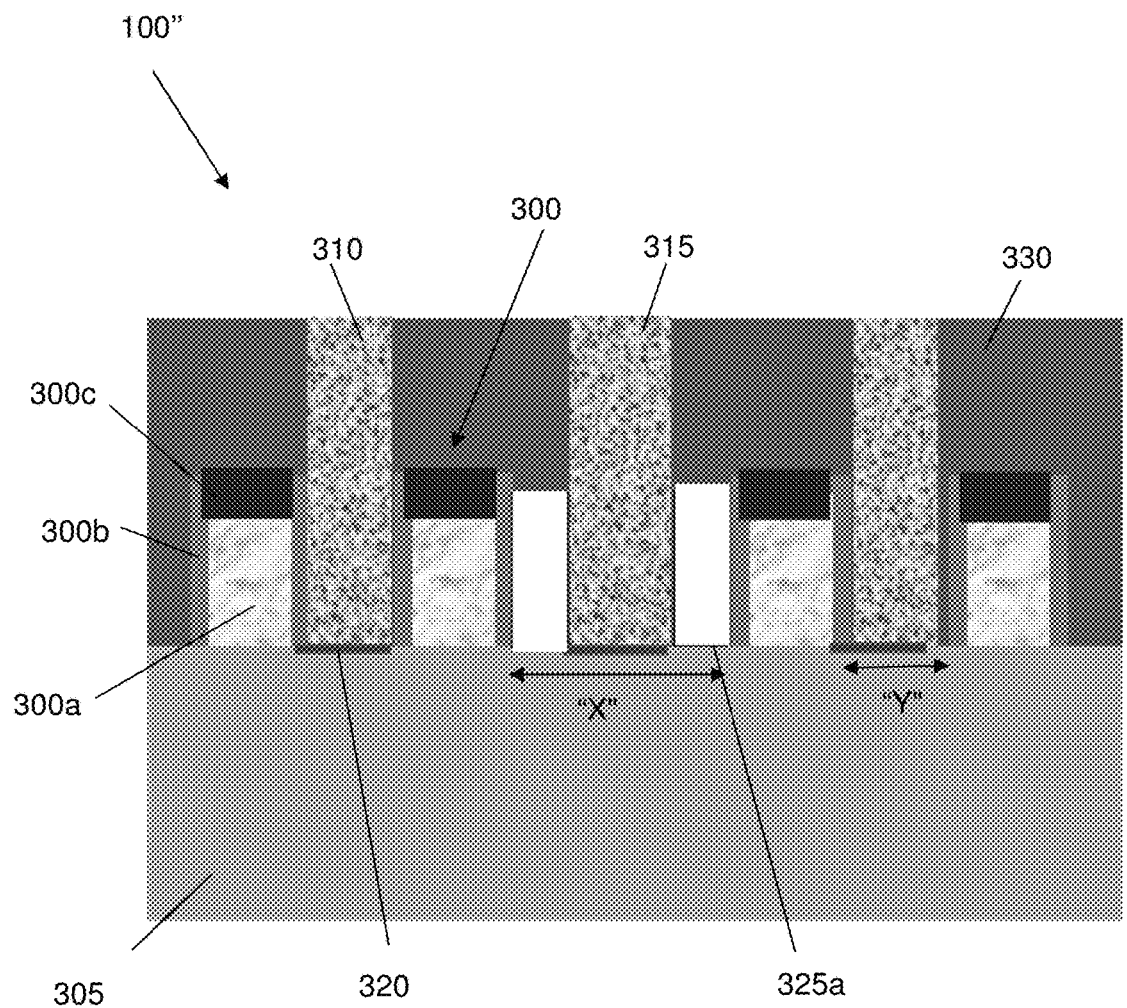
FIG. 3B shows a cross-sectional view of an SRAM structure with alternate gate pitches with an air gap in accordance with additional aspects of the present disclosure.

FIGS. 3A and 3B show respective cross-sectional views of an SRAM structure with alternate gate pitches in accordance with additional aspects of the present disclosure. In embodiments, the SRAM structures shown in FIGS. 3A and 3B can be representative of the SRAM array of either FIG. 1 or FIG. 2.

In embodiments, the SRAM structures 100" shown in FIGS. 3A and 3B include a plurality of gate structures 300 formed on either a bulk substrate or silicon on insulator (SOI) substrate 305. In embodiments, the substrate 305 may be composed of any suitable material including, but not limited to, Si, SiGe, SiGeC, SiC, GaAs, InAs, InP, and other III/V or II/VI compound semiconductors.

It should be recognized by those of ordinary skill in the art that the substrate 305 can be representative of a fin structure, in which the plurality of gate structures 300 wrap around. The fin structure can be manufactured using conventional sidewall image techniques (SIT). For example, in SIT techniques, a mandrel is formed substrate using conventional deposition processes, e.g., chemical vapor deposition (CVD) processes. A resist is formed on the mandrel material, which is exposed to light to form a pattern (openings). A RIE process is performed through the openings to form the mandrels, which may have different widths and/or spacing depending on the desired dimensions. Spacers are formed on the sidewalls of the mandrels which are preferably material that is different than the mandrels, and which are formed using conventional deposition processes known to those of skill in the art. The spacers can have a width which matches the dimensions of the fin structures, for example. The mandrels are removed or stripped using a conventional etching process, selective to the mandrel material. An etching is then performed within the spacing of the spacers to form the sub-lithographic features, e.g., fin structures. The sidewall spacers can then be stripped.

Still referring to FIGS. 3A and 3B, each of the gate structures 300 include metal gate material 300a, e.g., workfunction metals, sidewall spacers 300b and a capping material 300c (e.g., nitride material). In embodiments, the gate structures 300 also include dielectric material, e.g., a high-k gate dielectric material. In embodiments, the high-k dielectric material can be, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The plurality of gate structures 300 can be manufactured in accordance with conventional CMOS processes in either a gate first process or a gate last process. And, although not a limiting feature of the present disclosure, the gate structures 300 can have a width of about 20 nm, with the sidewall spacers 300b having a thickness of about 10 nm; although other dimensions are contemplated herein.

In embodiments, the plurality of gate structures 300 will include different pitches, e.g., spacing "X" and "Y" as described with respect to FIGS. 1 and 2. In embodiments, the different pitches, e.g., spacing "X" and "Y", can be manufactured using a mandrel technique, as described herein. In this approach, the mandrel material can be amorphous carbon or amorphous silicon, which provides selectivity to other materials of the structure.

Still referring to FIGS. 3A and 3B, source/drain contacts 310 and bitline contact 315 can be formed on silicide contacts 320 within the spacing "X" and "Y". As should be understood by those of skill in the art, the silicide contacts 320 can be manufactured using a conventional silicide process. For example, the silicide process begins with deposition of a thin transition metal layer, e.g., nickel, cobalt or titanium, over fully formed and patterned semiconductor devices (e.g., doped or ion implanted source and drain regions). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 320 in the active regions of the device. It should be understood by those of skill in the art that silicide contacts 320 will not be required on the devices, when a gate structure is composed of a metal material.

The source/drain contacts 310, bitline contact 315 (and other contacts, e.g., Vcc, Vdd contacts) can be formed by conventional lithography, etching and deposition methods. For example, a resist formed over insulator material 330 is exposed to energy (light) to form a pattern (opening). An etching process with a selective chemistry, e.g., reactive ion etching (RIE), is used to form one or more trenches in the insulator material 330 through the openings of the resist. Following the resist removal, conductive material, e.g., tungsten, can be deposited by any conventional deposition processes, e.g., CVD processes, in the trenches. Any residual material on the surface of the insulator material 330 can be removed by conventional chemical mechanical polishing (CMP) processes.

In both FIGS. 3A and 3B, the source/drain contacts 310 are provided within the spacing "Y", which is smaller than spacing "X". Also, as shown in FIGS. 3A and 3B, the source/drain contacts 310 are abutting directly against the sidewalls spacers 300b. As shown in FIG. 3A, though, the bitline contact 315 is provided within the spacing "X", with a low-k dielectric material 325 between the bitline contact 315 and respective gate structures 300. In embodiments, the low-k dielectric material 325 can have a width (thickness) of about 5 nm to about 20 nm (or more). In a more specific example, the width of the low-k dielectric material 325 can be about 8 nm. The low-k dielectric material 325 can be composed of $SiO_2C$ or $SiO_2$, as examples.

In alternative embodiments, as shown in FIG. 3B, an air gap 325a can be provided between the bitline contact 315 and respective gate structures 300. The air gap 325a can be manufactured using conventional deposition processes with pinch-off techniques known to those of skill in the art. In embodiments, the air gap 325a can have a width (space) of about 5 nm to about 20 nm (or more). In a more specific example, the width of the air gap 325a can be about 8 nm. It should be understood by those of skill in the art that both the low-k dielectric material 325 and air gap 325a will reduce the bitline capacitance, hence increasing the performance of the SRAM.

FIG. 4 shows a comparison graph of capacitance reduction. More specifically, FIG. 4 shows a bar graph of a conventional SRAM, a SRAM array with $SiO_2$ spacers (e.g., similar to the structure shown in FIG. 3A) and a SRAM array with air gap spacers (e.g., similar to the structure shown in FIG. 3A). In this graphical estimation, (i) the dielectric constant of the low-k spacer for the conventional SRAM array is 5.0, (ii) the dielectric constant of the $SiO_2$ spacers is 3.9, (iii) the dielectric constant of the air gap is 1.0 (iv) the low-k spacer has a thickness of 9 nm, and (v) the $SiO_2$ spacers and the air gap have a width of 8 nm. Taking these numbers into account, the SRAM array with $SiO_2$ spacers shows an overall reduction in bitline capacitance of 18.5% compared to the conventional SRAM array; whereas, the SRAM array with air gap spacers shows an overall reduction in bitline capacitance of 28.4% compared to the conventional SRAM array.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising an array of memory cells having a plurality of gate structures with varying gate pitches, the varying gate pitches comprising a first dimension sized for placement of a bitline contact and a second dimension sized for placement of source/drain contacts, the first dimension being larger than the second dimension, wherein the first dimension is sized for Vdd and Vcc contacts.

2. The structure of claim 1, wherein an insulator is provided on sides of the bitline contact between respective gate structures within the first dimension.

3. The structure of claim 2, wherein the insulator is $SiO_2$ material.

4. The structure of claim 2, wherein the insulator is an air gap.

5. The structure of claim 2, wherein the insulator has a dimension of about 5 nm to about 20 nm.

6. The structure of claim 5, wherein the insulator has a dimension of about 8 nm.

7. The structure of claim 1, wherein the first dimension is about 55 nm to about 80 nm.

8. The structure of claim 7, wherein the source/drain contacts directly abut against sidewall spacers of respective opposing gate structures.

9. The structure of claim 1, wherein the array of memory cells is a static random access memory (SRAM).

10. The structure of claim 1, wherein:
the plurality of gate structures includes a pass gate, pull up gates and pull down gates;
a distance "X" between the pass gate, the pull up gates and the pull down gates associated with Vdd, Vcc contacts and the bitline contacts is larger than a distance "Y" between the pass gate, the pull up gates and the pull down gates of non-critical areas, which do not have any of the Vdd or Vcc contacts or the source/drain contacts; and
a space between each of the Vdd, Vcc contacts and the bitline contacts and the respective pass gate, the pull up gates and the pull down gates is filled with an insulator material or air gap.

11. The structure of claim 10, wherein the source/drain contacts and the bitline contacts are formed on silicide contacts within the spacing "X" and "Y" in active regions of the structure, the source/drain contacts are provided within the spacing "Y", which is smaller than the spacing "X", and the bitline contact is within the spacing "X", with a low-k dielectric material between the bitline contact and respective gate structures.

12. A static random access memory (SRAM), comprising:
a plurality of gate structures;
a first space between opposing gate structures of the plurality of gate structures;
bitline contacts located in the first space between selected ones of the opposing gate structures; and
a second space between other opposing gate structures of the plurality of gate structures, the second space being smaller than the first space,
wherein the first space is sized for Vdd and Vcc contacts.

13. The SRAM of claim 12, further comprising source/drain contacts in the second space.

14. The SRAM of claim 12, wherein the Vcc and Vdd contacts are located in the first space between selected ones of the opposing gate structures.

15. The SRAM of claim 14, wherein the first space and the second space alternate with one another on opposing sides of respective gate structures of the plurality of gate structures.

16. The SRAM of claim 12, wherein the first space and the second space are provided within a same vertical extent of an array of cells in the SRAM.

17. The SRAM of claim 12, further comprising low-k dielectric material provided on sides of the bitline contacts located in the first space between selected ones of the opposing gate structures.

18. The SRAM of claim 12, further comprising air gaps provided on sides of the bitline contacts located in the first space between selected ones of the opposing gate structures.

19. A structure comprising an array of memory cells having a plurality of gate structures with varying gate pitches, the varying gate pitches comprising a first dimension sized for placement of a bitline contact and a second dimension sized for placement of source/drain contacts, the first dimension being larger than the second dimension, wherein the first dimension and the second dimension alternate with one another within gate structures in the array of memory cells.

* * * * *